United States Patent
Otsuka

(10) Patent No.: US 8,279,654 B2
(45) Date of Patent: Oct. 2, 2012

(54) RESISTANCE CHANGE MEMORY DEVICE AND OPERATION METHOD OF THE SAME

(75) Inventor: Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 140 days.

(21) Appl. No.: 12/755,823

(22) Filed: Apr. 7, 2010

(65) Prior Publication Data

US 2010/0265757 A1  Oct. 21, 2010

(30) Foreign Application Priority Data

Apr. 15, 2009  (JP) ................. 2009-098639

(51) Int. Cl.
*G11C 11/00* (2006.01)

(52) U.S. Cl. ............ 365/148; 365/100; 365/163
(58) Field of Classification Search .......... 365/148, 365/100, 163
See application file for complete search history.

(56) References Cited

U.S. PATENT DOCUMENTS

| 7,359,230 | B2 * | 4/2008 | Sumida et al. ............... 365/148 |
| 7,372,726 | B2   | 5/2008 | Matsuoka et al. |
| 7,391,639 | B2 * | 6/2008 | Gogl ........................... 365/148 |
| 2009/0122602 | A1 * | 5/2009 | Takemura et al. ............ 365/163 |
| 2010/0027320 | A1 * | 2/2010 | Muraoka et al. ............. 365/148 |

FOREIGN PATENT DOCUMENTS

WO  2005/098952  10/2005

OTHER PUBLICATIONS

K. Aratani et al.; A Novel Resistance Memory with High Scalability and Nanosecond Switching; Technical Digest IEDM 2007; pp. 783-786.

* cited by examiner

*Primary Examiner* — Anh Phung
(74) *Attorney, Agent, or Firm* — SNR Denton US LLP

(57) ABSTRACT

A resistance change memory device includes: memory cells each having a current path in which a storage element, whose resistance changes according to the voltage applied, and an access transistor are connected in series; first wirings each connected to one end of the current path; second wirings each connected to the other end of the current path; a well which is a semiconductor region in which the access transistors are formed; and a drive circuit.

9 Claims, 11 Drawing Sheets

RESISTANCE CHANGE MEMORY DEVICE AND OPERATION METHOD OF THE SAME

BACKGROUND OF THE INVENTION

1. Field of the Invention

The present invention relates to a resistance change memory device in which each of memory cells is formed by connecting a storage element, whose resistance changes according to the applied voltage, and an access transistor in series, and which is operated by reversing the polarity of a voltage applied to the storage element between data write and erase operations. The present invention also relates to an operation method of the resistance change memory device.

2. Description of the Related Art

Two types of resistance change memory devices are known, one in which a voltage of the same polarity is applied to the storage elements of the memory cells both during data write and erase operations, and another in which the polarity of an applied voltage is reversed between data write and erase operations. The former will be hereinafter referred to as a unipolar voltage-operated resistance change memory, and the latter a bipolar voltage-operated resistance change memory.

A so-called phase change memory (for example, refer to PCT Patent Publication No. WO2005/098952) is known as a unipolar voltage-operated resistance change memory.

As a bipolar voltage-operated resistance change memory, on the other hand, a resistance change memory device is well known which has, for each memory cell, a storage element whose resistance changes as a result of the injection or withdrawal of conductive ions into or from an insulating film (for example, refer to K. Aratani, etc. "A Novel Resistance Memory with High Scalability and Nanosecond Switching," Technical Digest IEDM 2007, pp. 783-786).

The storage element has a layered structure in which a layer adapted to supply the conductive ions and an insulating film are formed between two electrodes. The change in resistance of the storage element occurs in a reversible manner as a result of the migration of the conductive ions. This migration is caused by the application of a bipolar voltage.

A storage element (1R) having such a configuration and an access transistor AT (1T) are formed in a memory cell adapted to store one bit of information. A number of 1T1R memory cells are arranged in a matrix form to make up a memory cell array.

SUMMARY OF THE INVENTION

Semiconductor memories are required to operate at low voltage for reduction in memory cell size and power consumption.

In order to operate the above 1T1R memory cell, voltages of different polarity (meaning the direction in which the voltage is applied) are applied to the storage element (resistance change element). As a result, it is necessary to maintain the wiring (e.g., bit line) not connected to the resistance change element at a positive voltage during data write or erase operation. At this time, the drain of an access transistor AT is connected to the bit line, and the source thereof to the resistance change element. Therefore, the access transistor AT acts as a source follower. That is, the bit line voltage is not applied directly to the resistance change element. Instead, the voltage obtained by subtracting the threshold voltage of the access transistor AT from a word line voltage is applied to the resistance change element.

In order to operate the above 1T1R memory cell, therefore, the word line must be at a higher voltage than the voltage applied to the resistance change element, thus hindering the reduction in operating voltage.

It is desirable to provide a resistance change memory device which can be readily reduced in voltage when voltages of opposite polarity are applied to the storage element during data write and erase operations.

A resistance change memory device according to an embodiment of the present invention includes memory cells, first and second wirings, a well and a drive circuit.

Each of the memory cells has a current path in which a storage element and an access transistor are connected in series. The resistance of the memory cell changes according to the voltage applied.

Each of the first wirings is connected to one end of the current path.

Each of the second wirings is connected to the other end of the current path.

The well is a semiconductor region in which the access transistors are formed.

The drive circuit supplies a current to the storage element via the access transistor by applying a voltage between the first and second wirings during either one of data write and erase operations to and from the memory cells (first operation). Further, the drive circuit supplies a current to the storage element in the direction opposite to that for the first operation by applying a voltage of opposite polarity to that for the first operation between the first or second wiring and well during the other of the data write and erase operations (second operation).

In the present embodiment, it is preferred that the access transistor be connected to the first wiring, and the storage element to the second wiring so that a positive voltage relative to the potential of the first wiring is applied to the second wiring during the first operation.

The above configuration allows for a voltage to be applied to the well during the second operation. Therefore, there is no need to apply a voltage to the storage element via the access transistor at least during the second operation. As a result, the voltage applied, for example, between the well and second wiring is applied almost as-is across the storage element, thus eliminating wasteful voltage drop. Therefore, it is only necessary to apply a voltage, equivalent to that required to change the data storage status of the storage element, for example, between the well and second wiring.

On the other hand, a voltage is applied across the current path in which the access transistor and storage element are connected in series during the first operation. At this time, whether the access transistor acts as a source follower is determined by the direction of the voltage applied.

We assume here that the N-channel access transistor is connected to the first wiring, and the storage element to the second wiring. In this case, during the first operation, in order to prevent the access transistor from acting as a source follower, it is only necessary to apply a higher voltage to the second wiring than to the first wiring. In this case, no voltage is applied via the access transistor during the second operation as described above. As a matter of course, the access transistor does not act as a source follower.

In other words, before the present invention, in which no voltage is applied using the well, is applied, it is inevitable that the access transistor should always act as a source follower during the first or second operation. In contrast, the present invention allows for a voltage to be applied without the access transistor acting as a source follower.

An operation method of a resistance change memory device according to another embodiment of the present invention includes first and second operation steps.

The first operation step applies, during either one of data write and erase operations, a first voltage to a storage element of a memory cell. The memory cell has a current path in which the storage element, whose resistance changes according to the applied voltage, and an access transistor, are connected in series. At this time, the first voltage is applied to the storage element by applying a voltage across the current path.

The second operation step applies, during the other of the data write and erase operations, a second voltage of opposite polarity to the first voltage to the storage element. At this time, the second voltage is applied to the storage element by applying a voltage relative to the potential at one end of the storage element to a well. The well is electrically connected to the other end of the storage element and is a semiconductor region in which the access transistors are formed.

The present invention allows for a voltage to be applied without the source follower action of the access transistor, thus providing a resistance change memory device and operation method of the same which can be reduced in voltage.

DETAILED DESCRIPTION OF THE PREFERRED EMBODIMENTS

A description will be given below of embodiments of the present invention with reference to the accompanying drawings in the following order:

1. First embodiment: Embodiment in which an arbitrary configuration is used to supply a well voltage
2. Second embodiment: Embodiment in which a configuration is shown to supply a well voltage
3. Modification example 1. First Embodiment Memory Cell Configuration FIG. 1 is an equivalent circuit diagram of a memory cell according to an embodiment of the present invention.

Figure 1:
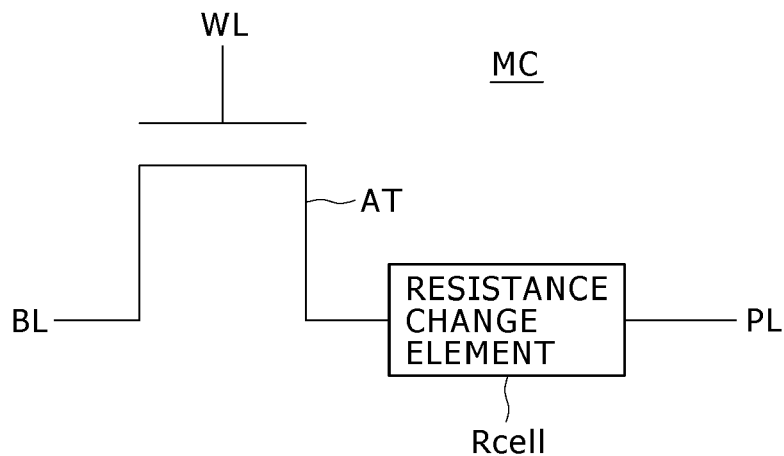
FIG. 1 is an equivalent circuit diagram of a memory cell according to an embodiment of the present invention.

A memory cell MC illustrated in FIG. 1 includes a variable cell resistor Rcell and an access transistor AT. The variable cell resistor Rcell serves as a "memory element."

The variable cell resistor Rcell has one end connected to a plate line PL, and the other end to the source of the access transistor AT. The access transistor AT has its drain connected to a bit line BL and its gate to a word line WL. The word line WL serves as an "access line."

Here, the bit line BL corresponds to an example of a "first wiring," and the plate line PL to an example of a "second wiring." Further, the plate line PL may be an example of the "first wiring," and the bit line BL an example of the "second wiring." In the description given below, we assume that the bit line BL is the first wiring, and the plate line PL the second wiring.

It should be noted that although an N-type MOS transistor is used as the access transistor AT in FIG. 1, a P-type MOS transistor may be used instead. However, it is commonly preferred that an N-type MOS transistor be used because of its higher current driving capability than a P-type MOS transistor.

Figure 2:
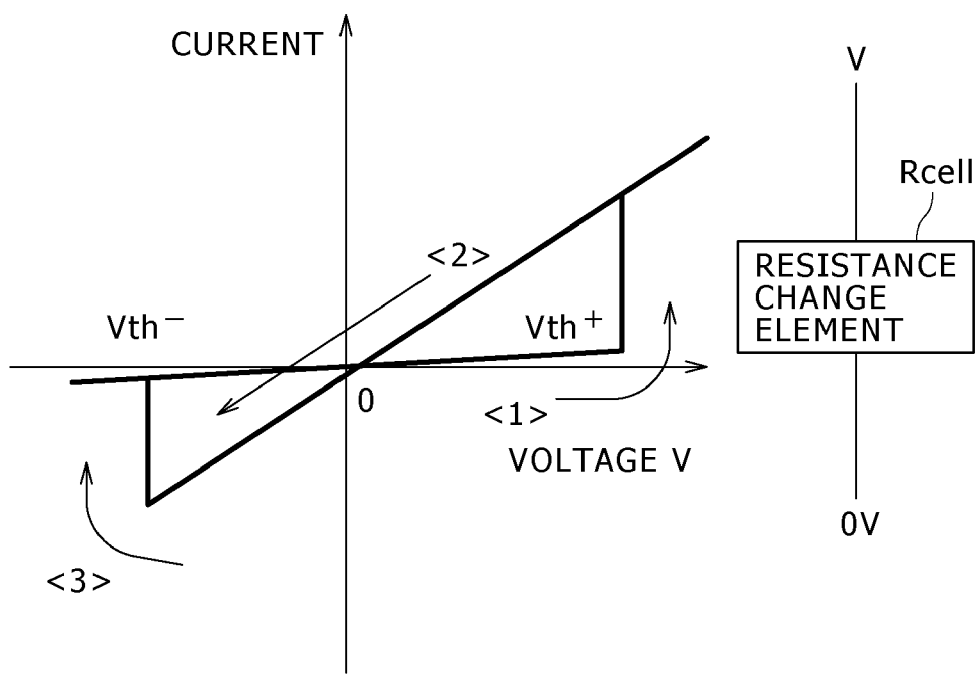
FIG. 2 is a graph illustrating the current-voltage characteristic (hysteresis characteristic) of a variable cell resistor.

FIG. 2 illustrates a current-voltage characteristic (hysteresis characteristic) of the variable cell resistor Rcell. The horizontal axis of the graph represents the magnitude of a voltage V applied to the same resistor Rcell, and the vertical axis the magnitude of the current flow at that time.

Referring to FIG. 2, with one of the two terminals of the variable cell resistor Rcell maintained at 0V, the voltage V applied to the other terminal is gradually increased. In this initial voltage increasing step <1>, a current scarcely flows due to high resistance of the variable cell resistor Rcell. As the voltage V increases further and exceeds a given threshold voltage (Vth+), the same resistor Rcell undergoes a transition to a state in which a current flow rises sharply (transition to low resistance) as shown by <1> in the graph. After this transition occurs to a low resistance state, a more current will flow with increase in the voltage V thanks to the lower resistance (steeper slope).

Once the variable cell resistor Rcell undergoes a transition a low resistance state, this state will be maintained even if the voltage is reduced (<2> in the graph).

If the voltage V is continuously swept in the negative direction, the variable cell resistor Rcell undergoes a transition to an initial high resistance state in which a current scarcely flows through the same resistor Rcell when a given threshold voltage (threshold voltage (Vth−)) is exceeded, as shown by <3> in the graph. From here onward, no matter how much the voltage V is varied in the negative direction, the high resistance state will be maintained. Further, this state will be maintained even if the voltage V is restored to 0 V.

It is clear that such an electrical characteristic has a hysteresis with two states, a low resistance state in which the slope is relatively large after crossing the zero level and a high resistance state in which the slope is relatively small after crossing the zero level.

Describing this with an example using more specific values, when, for example, a voltage of +1.0 V or more is applied to the variable cell resistor Rcell with an initial resistance of 1 MΩ or more, the same resistor Rcell undergoes a transition to a state in which its resistance is several tens of kΩ, causing the current flow to increase sharply. Even if the voltage is restored to 0 V thereafter, the resistance will be maintained at several tens of kΩ.

Next, a voltage opposite in polarity to that for data write operation is applied to the variable cell resistor Rcell. When the applied voltage is −1.0 V or higher, the low resistance state is maintained, thus causing a current appropriate to the resistance of the variable cell resistor Rcell and the applied voltage to flow through the same resistor Rcell. When a negative voltage less than −1.0 V is applied, the current flow will diminish sharply, raising the resistance of the variable cell resistor Rcell to 1 MΩ or more. Further, the high resistance state is maintained even if the voltage V is restored to 0 V.

As described above, the variable cell resistor Rcell exhibits a resistance hysteresis when voltages of different polarity are applied. The resistance of the same resistor Rcell is maintained even if the voltage is removed. As a result, the variable cell resistor Rcell serves as a non-volatile resistance change element. In other words, if the two states are associated with binary data, data inversion is possible, thus allowing for data to be written to the same resistor Rcell. It should be noted that the term "different polarity" refers in the present invention to the fact that voltages are applied across the variable cell resistor Rcell in different directions.

Figure 3:
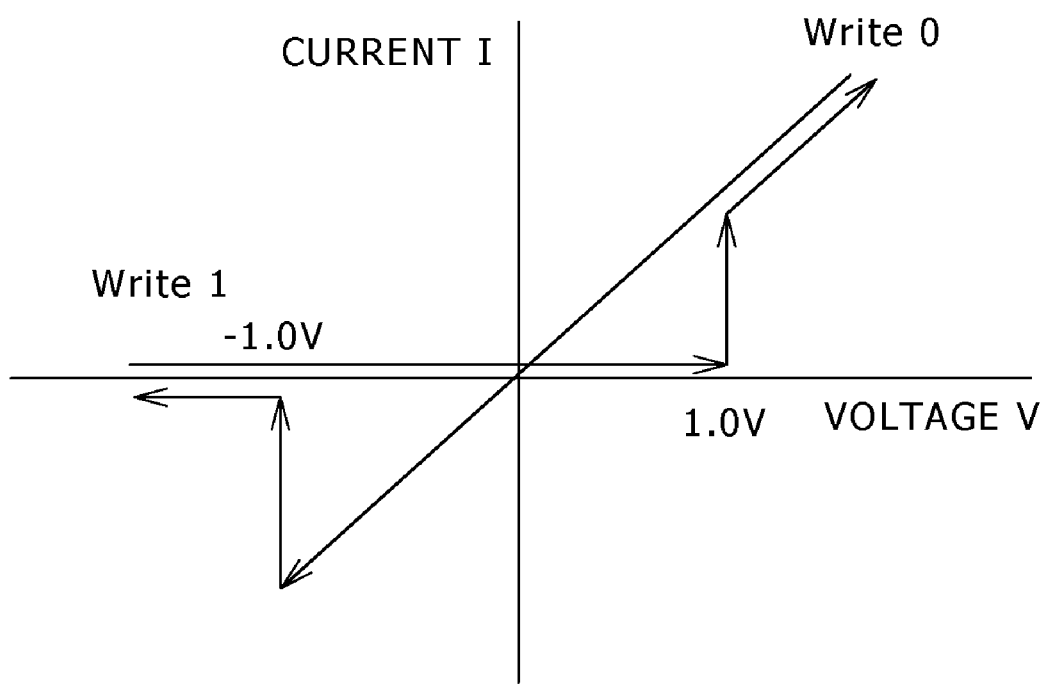
FIG. 3 is a graph of the hysteresis characteristic for illustrating an example of threshold voltage during set and reset operations.

More specifically, as illustrated in FIG. 3, data "0" can be written (Write0) by applying a voltage of 1.0 V or higher to the cell. Conversely, data "1" can be written (Write1) by applying a voltage of −1.0 V or lower to the cell. It should be noted that one of (Write0) and (Write1) is commonly referred to as write operation, and the other as erase operation. However, this definition is arbitrary.

In order to read the memory data, a voltage of about zero point several volts, for example, is applied to the memory cell. At this time, the resistance of the variable cell resistor Rcell varies depending on the write state. Therefore, whether the same resistor Rcell is in the high resistance state (e.g., data "0" is written) or low resistance state (e.g., data "1" is written) can be determined by reading the resistance.

The above case is when the memory data is read on the side of Write0 (high resistance state). However, the data can also be read on the side of Write1 (low resistance state), for example, by applying a voltage of minus zero point several volts to the cell.

[Cell Operation Before the Application of the Present Invention]

Figure 4A:
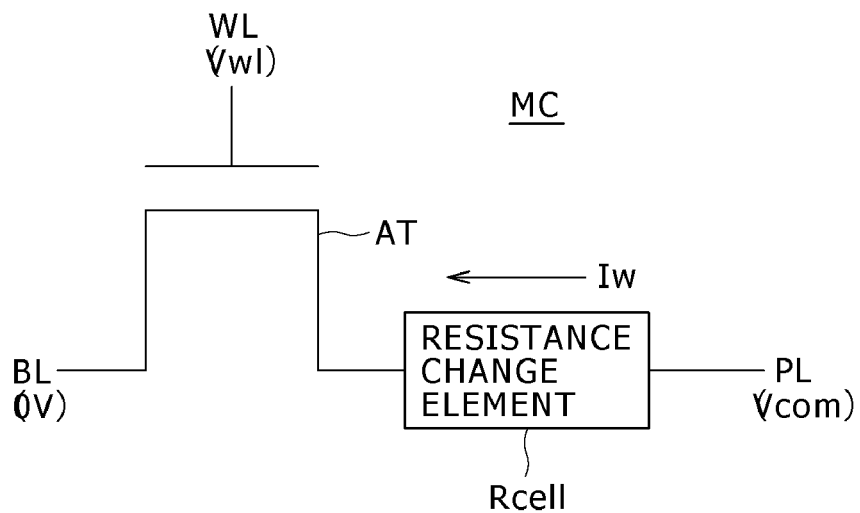
FIGS. 4A and 4B are explanatory diagrams of the operation of the memory cell according to the embodiment of the present invention.
Figure 4B:
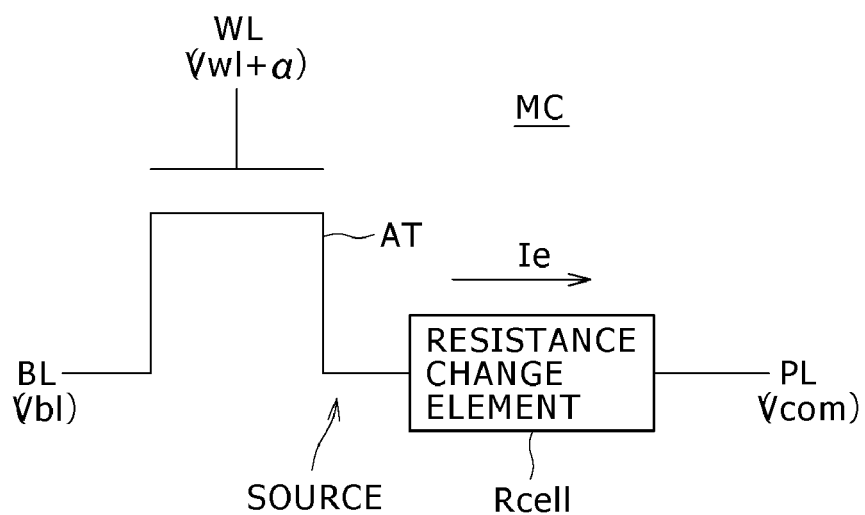

FIGS. 4A and 4B are explanatory diagrams of the operation of the memory cell. Here, FIG. 4A illustrates the direction of a write current Iw, and FIG. 4B that of an erase current Ie. The configuration of the memory cell is the same in the two figures.

FIG. 4A illustrates the write (or set) operation. The set operation is composed of causing the variable cell resistor Rcell to make a transition from a high to low resistance state.

A positive voltage Vwl is applied to a word line WL (access line) to turn ON the access transistor AT. Next, 0 V is applied to the bit line BL (first wiring), and a voltage Vcom, higher than the threshold voltage (Vth+) shown in FIG. 2, to the plate line PL (second wiring). As a result, the write current Iw flows in the direction shown in FIG. 4A, causing the variable cell resistor Rcell to make a transition to a low resistance state.

FIG. 4B illustrates the erase (or reset) operation. The reset operation is composed of restoring (resetting) the variable cell, for example, to an initial high resistance state from a low resistance state.

A positive voltage (Vwl+α) is applied to the word line WL to turn ON the access transistor AT. Simultaneously with or in advance to the application of the positive voltage (Vwl+α), the voltage (Vcom) is applied to the plate line PL, and a voltage (Vbl), higher than the voltage (Vcom) and the threshold voltage (Vth−) shown in FIG. 1, to the bit line BL. As a result, the erase current Ie flows in the direction shown in FIG. 4B, causing the variable cell resistor Rcell to make a transition to a high resistance state.

During the reset operation before the present invention is applied, the source of the access transistor AT is not grounded. As a result, the same transistor AT acts as a source follower. In order to apply a voltage greater in magnitude than the threshold voltage (Vth−) to the storage element (variable cell resistor Rcell) in the direction opposite to that during the set operation, therefore, a word line voltage at least higher than the positive voltage (Vwl) during the set operation, i.e., the positive voltage (Vwl+α), is required. This is not desirable for providing reduced word line voltage. For this reason, the present embodiment proposes a voltage application method described below.

[Cell Operation After the Application of the Present Invention]

Figure 5A:
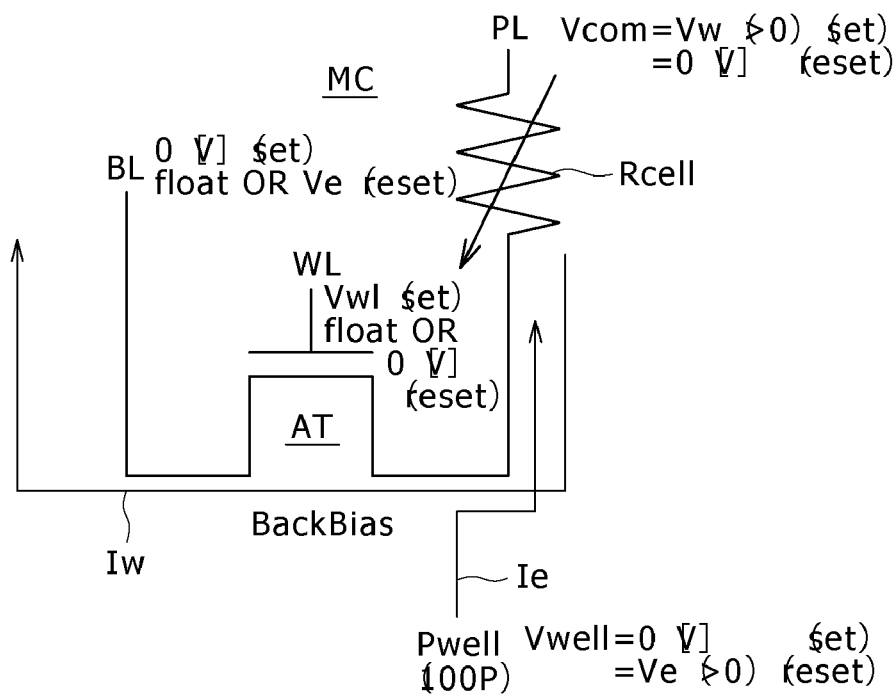
FIGS. 5A and 5B are cell equivalent circuit diagrams illustrating a voltage application method according to the embodiment of the present invention together with the voltage application method of a comparative example.
Figure 5B:
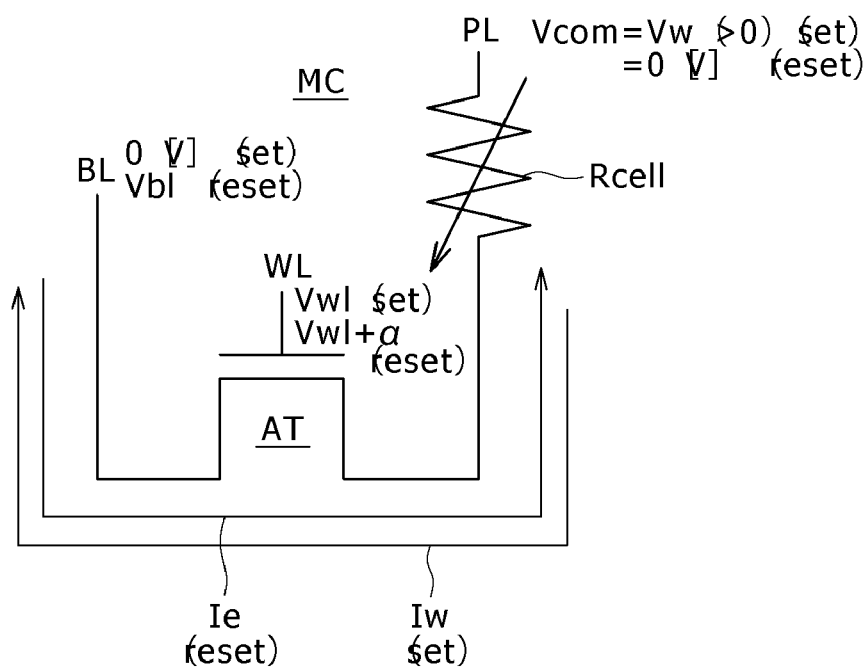

FIG. 5A illustrates the cell operation after the application of the present invention, and FIG. 5B the cell operation before the application of the present invention as a comparative example.

In the cell operation shown in FIG. 5B, voltages of different polarity are applied, one for data write operation and another for data erase operation.

More specifically, as illustrated in FIG. 5B, the bit line BL is maintained, for example, at 0 V, and a positive write voltage Vw (first level of Vcom) is applied to the plate line PL during the set operation. Further, the positive voltage (Vwl) is applied to the word line WL. As a result, the write current Iw flows from the plate line PL to the bit line BL, causing the variable cell resistor Rcell to make a transition from a high to low resistance state.

During the reset operation, the plate line PL is maintained at 0 V (second level of Vcom), and a positive voltage (Vbl) is applied to the bit line BL. Further, the positive voltage (Vwl+α) is applied to the word line WL. As a result, the erase current Ie flows from the bit line BL to the plate line PL, causing the variable cell resistor Rcell to make a transition from a low to high resistance state.

In this reset operation, the access transistor AT acts as a source follower as described earlier. This makes it impossible to efficiently apply a voltage to the variable cell resistor Rcell. If an attempt is made to raise the voltage at the connection midpoint between the variable cell resistor Rcell and access transistor AT to 1 V, i.e., the voltage level during the erase operation, or higher, at least the gate voltage (Vwl) during the erase operation must be (1 V+Vth+β) or higher. Here, the symbol Vth represents the threshold voltage of the access transistor AT, and the symbol β the margin of element-to-element variation. The relationship between this margin of element-to-element variation β and α, shown in FIG. 5B, can be expressed as (β=Vth+α).

An example using more specific values is given below.

For example, if the threshold voltage Vth of the access transistor AT is 1 V, and the margin of element-to-element variation β 0.5 V, a gate voltage of (1 V+1 V+0.5 V=) 2.5 V is required. In order to ensure reliability for driving the variable cell resistor Rcell at 2.5 V, the gate insulating film of the access transistor AT must be about 3 nm. As a result, it is impossible to secure a drive current required for the state transition of the variable cell resistor Rcell, thus resulting in failed write operation or insufficient voltage reduction. Therefore, a higher voltage is also required for the write operation (high to low resistance state), thus making it impossible to provide reduced voltage.

In order to achieve an operating margin using this method, the access transistor AT must be designed to a large size (e.g., gate width W) so that current and voltage can be applied efficiently to the variable cell resistor Rcell. This, however, leads to an increased memory cell area.

In the cell operation after the application of the present invention shown in FIG. 5A, voltages are applied in the following manner to the variable cell resistor Rcell during the write and erase operations.

That is, when a voltage of such polarity is applied as to ground the source of the access transistor AT (write operation in the illustrated example), the positive voltage Vw is applied to the plate line PL, and a voltage (e.g., 0 V) lower than the voltage Vw to the bit line BL, as in the comparative example.

On the other hand, the cell operation according to the present invention is significantly different from that according to the comparative example in voltage application path used to apply a voltage of such polarity as to cause the access transistor AT to act as a source follower (erase operation in the illustrated example) in the comparative example.

In a word, the well having the access transistor AT formed therein (P-type well in the case of an NMOS transistor) is used. Although the well structure will be described later, the P-type well (hereinafter P well) forms a PN junction together with the N-type source/drain region of the access transistor AT. Therefore, a voltage can be applied under a low resistance condition in the direction to forward-bias the PN junction. When a forward bias is applied to the P well, a voltage required for the transition to a high resistance state is applied to the variable cell resistor Rcell thanks to a well bias voltage and the voltage of the plate line PL.

More specifically, in FIG. 5A, a positive well voltage Vwell is applied to the P well in FIG. 5A, and the plate line PL is maintained at 0 V, i.e., the second level of the voltage Vcom. As a result, the erase current Ie flows from the P well to the plate line PL, causing the variable cell resistor Rcell to make a transition from a low to high resistance state.

This voltage application method does not require the word line voltage to be increased as a result of the source follower action, thus providing reduced voltage applied to the access transistor AT. Further, a thin gate insulating film can be used for the same transistor AT, thus providing enhanced current driving capability of the same transistor AT and contributing to reduced size of the memory cell at the same time.

[IC Chip Configuration]

Figure 6:
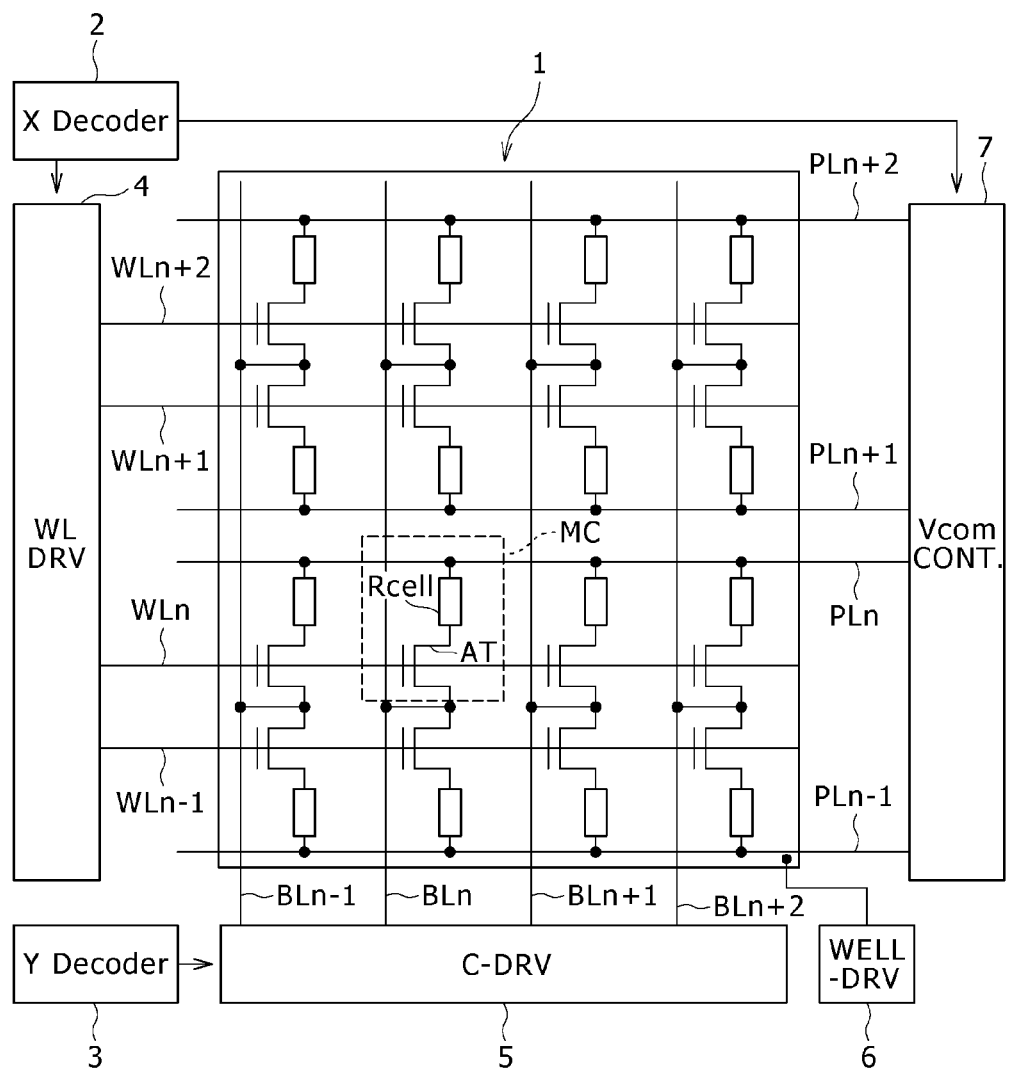
FIG. 6 is a block diagram of a memory cell array and peripheral circuitry of a resistance change memory device according to the embodiment of the present invention.

FIG. 6 is a block diagram of an IC chip of the resistance change memory device according to the embodiment of the present invention.

The resistance change memory device illustrated in FIG. 6 includes a memory cell array 1 and its peripheral circuitry. The memory cell array 1 has a given number of the memory cells MC shown in FIGS. 1, 4 and 5 arranged in rows and columns in a matrix form. FIG. 6 typically illustrates an array portion which includes a four by four matrix of the memory cells MC.

In the memory cell array 1, four word lines WLn−1 to WLn+2 are arranged in the column direction with a given spacing therebetween. Each of the word lines WLn−1 to WLn+2 connects together the gates of the access transistors AT of the four memory cells MC arranged in the row direction. Further, four bit lines BLn−1 to BLn+2 are arranged in the row direction with a given spacing therebetween. Each of the bit lines BLn−1 to BLn+2 connects together the drains of the access transistors AT of the four memory cells MC arranged in the column direction.

Four plate lines PL are arranged in the column direction with a given spacing therebetween. Each of the plate lines PL connects the nodes of the variable cell resistors Rcell on the side opposite to the access transistors AT together in row direction. Each of the four plate lines PL has one end led out of the memory cell array 1.

It should be noted that the plate lines PL may be arranged long in the column direction. Although arranged orthogonal to each other in FIG. 6, the bit lines BL and plate lines PL may be arranged parallel to each other.

The peripheral circuitry corresponds to the "drive circuit" of the present invention and includes an X (address) decoder (X Decoder) 2 and Y (address) decoder (Y Decoder) 3 as shown in FIG. 6. The peripheral circuitry further includes a WL driver (WL DRV) 4, column driver (C-DRV) 5, well driver (WELL-DRV) 6 and Vcom control circuit (Vcom CONT.) 7 serving as a plate line driver. It should be noted that the column driver 5 includes all the circuits for column control such as sense amplifiers, column switches, I/O buffers and write/erase driver. Further, although not illustrated, the circuits required for the memory operation such as control circuits and power supply circuits are integrated in an IC chip.

Either the X decoder 2 or Y decoder 3 is also capable of serving as a predecoder. A predecoder is a circuit adapted to separate an input address signal into X and Y addresses. A predecoder may be provided separately from the X decoder 2 and Y decoder 3.

The X decoder 2 decodes the X address signal from the predecoder and transmits the X select signal, selected based on the decoding result, to the WL driver 4.

The Y decoder 3 decodes the Y address signal from the predecoder and transmits the Y select signal, selected based on the decoding result, to the column driver 5.

The WL driver 4 includes four WL driver units (not shown), one for each of the word lines WL. The associated one of the word lines WLn−1 to WLn+2 is connected to the output of one of the WL driver units. One of the WL driver units is selected in response to the X select signal from the X decoder 2. The WL driver unit is a circuit adapted, when selected, to apply a given voltage to the word line WL which is connected to the output of the WL driver unit.

The column switches (not shown) in the column driver 5 are a group of switches adapted to connect at least one of the bit lines BLn−1 to BLn+2 to other circuit in the column driver 5 in response to the input Y select signal. The sense amplifiers which are not shown are circuits adapted to read the potential of the bit line selected by the column switch based on the sense amplifier activation signal generated in response to the input Y select signal. Further, the write/erase driver is a circuit adapted to set the bit line, selected to be activated via the column switch, to the voltage required for the write or erase operation. During the write operation, the bit line voltage takes on the value appropriate to the data fed via the I/O buffer.

The well driver 6 is a circuit adapted to apply the well voltage Vwell shown in FIG. 5A to the P well of the memory cell array 1 and control the potential of the same voltage Vwell.

The Vcom control circuit 7 is a circuit adapted to control the potential of the voltage Vcom applied to the four plate lines PLn−1 to PLn+2. It should be noted that the same circuit 7 may apply a common voltage to all the four plate lines PLn−1 to PLn+2. Alternatively, the same circuit 7 may control the voltage levels applied respectively to the four plate lines. If a common voltage is applied, the four plate lines PLn−1 to PLn+2 may be connected to a single common plate line, and this common plate line to the Vcom control circuit 7. This common plate line is one form of the "second wiring" of the present invention, as with the plate lines PL.

The control circuit which is not shown receives write, erase and data read signals from external equipment and controls the blocks of other peripheral circuits based on these three signals. The detailed description of this control will be omitted.

[Memory Cell Array and Memory Cell Structure]

Figure 7:
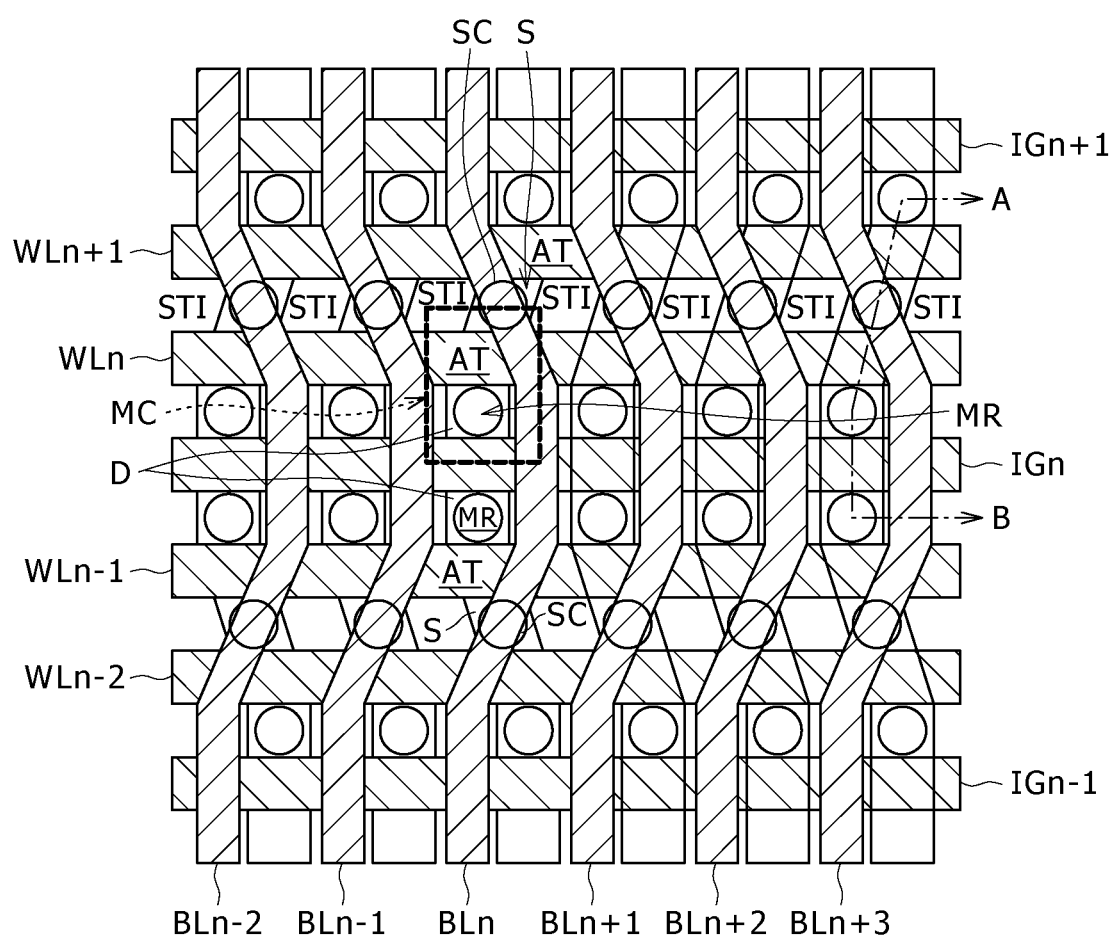
FIG. 7 is a plan pattern diagram of a fine cell of the memory cell array according to the embodiment of the present invention.
Figure 8:
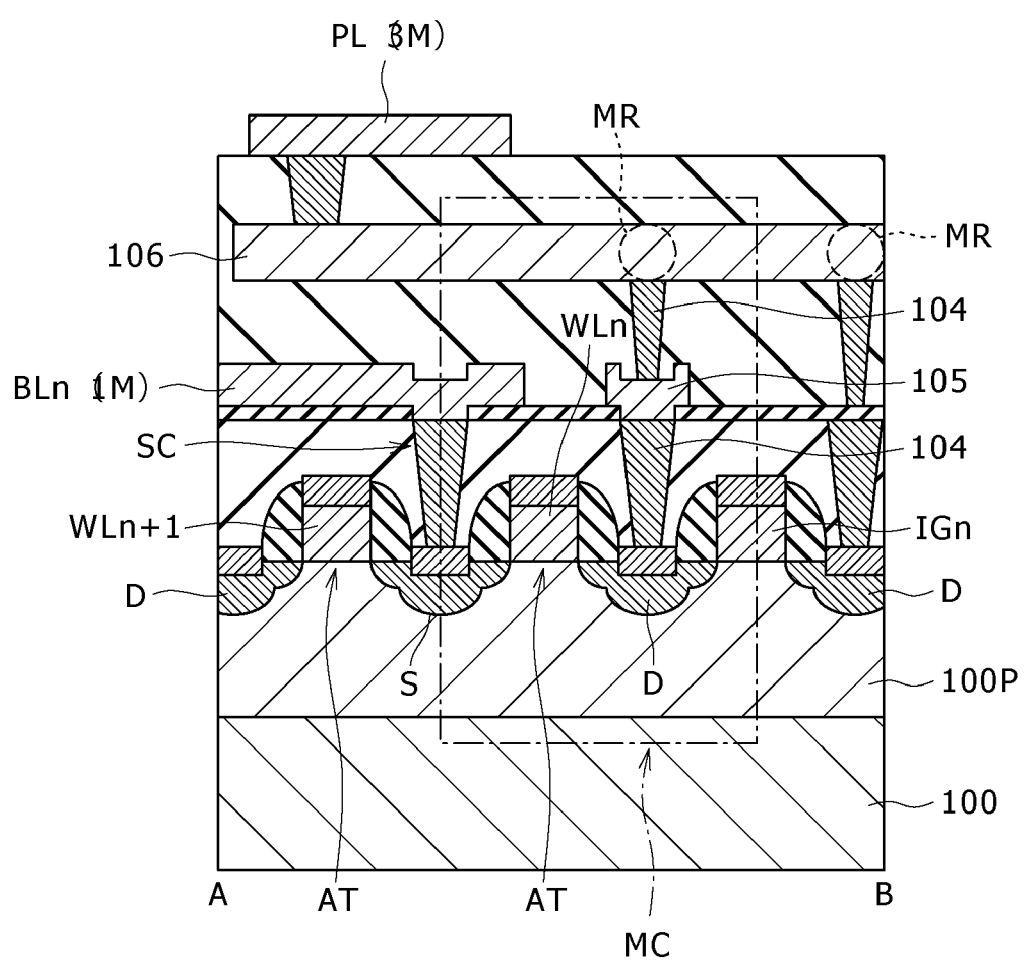
FIG. 8 is a diagrammatic sectional view taken along line A-B of FIG. 7.
Figure 9:
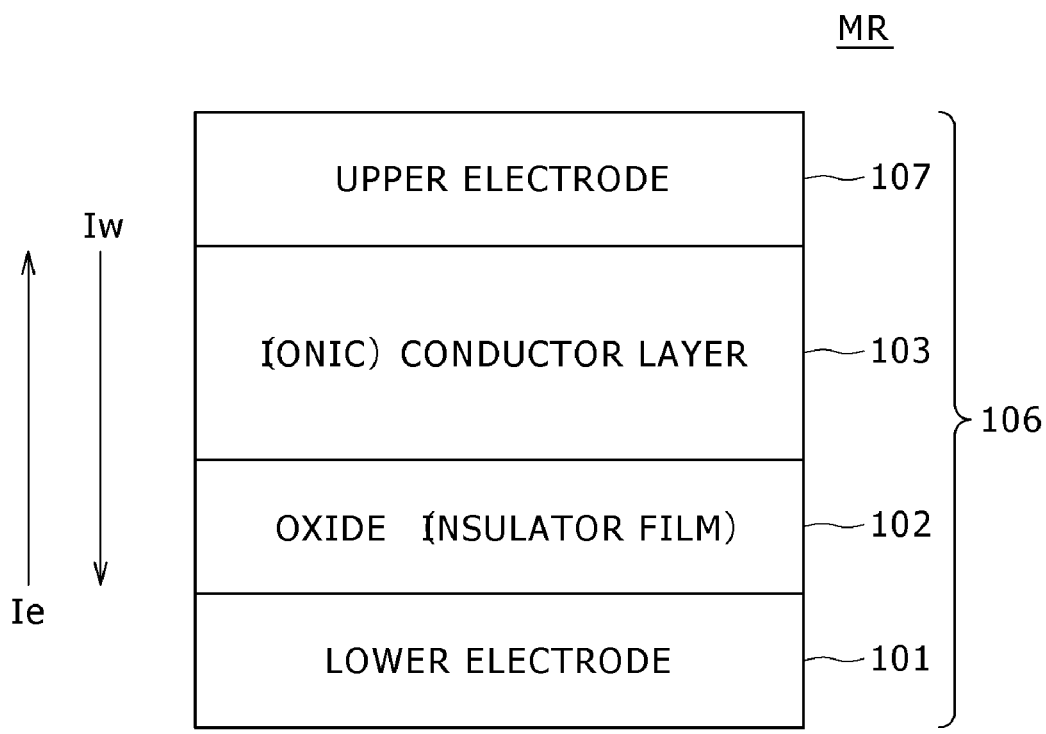
FIG. 9 is a schematic diagram illustrating the layered structure of the variable cell resistor.

FIG. 7 illustrates a plan view of the memory cell array 1. FIG. 7 is a plan view illustrating a six-by-four matrix of cells. FIG. 8, on the other hand, is a diagrammatic sectional view taken along line A-B of FIG. 7. FIG. 9 is a schematic diagram illustrating the layered structure of a storage region MR of the variable cell resistor Rcell.

In the plan pattern of the memory cell array 1 shown in FIG. 7, the region enclosed by a thick dashed line corresponds to the memory cell MC adapted to store one bit of information.

The bit lines BL (BLn−2 to BLn+3) extend roughly in the column direction. The bit lines are arranged parallel to each other. However, each of the bit lines BL meanders. This is done to allow source contacts SC to be connected together while avoiding the contact portion of the storage region MR on the overlying layer. Two columns of the memory cells MC in the row direction are adjacent to each other. In these two columns of the cells, the two memory cells adjacent to each other in the column direction share the source contact SC (sectional view of FIG. 8 and circuit diagram of FIG. 6).

As for the word lines WL (WLn−2 to WLn+1) in the row direction, each two word lines, associated with the two columns of the cells sharing the source contact SC, are adjacent to each other. In FIG. 7, there are two such pairs of the word lines. That is, the word lines WLn and WLn+1 are adjacent to each other as one word line pair, and the word lines WL−2 and WLn−1 as another word line pair. An isolation gate IGn is provided between the word line pairs. The same gate IGn is arranged parallel to the word lines. In FIG. 7, this configuration is repeated in the column direction. Therefore, two other isolation gates IGn−1 and IGn+1 are also shown.

The source sharing structure and the meandering arrangement of bit lines as described above contribute to reduced array area. Letting the minimum feature size (wiring width and wiring-to-wiring spacing) be denoted by F, the single memory cell MC has been miniaturized down to about 2F×3F=6F².

In the memory cell MC illustrated in FIG. 8, the access transistor thereof is formed in a semiconductor substrate 100.

More specifically, a P well 100P is formed in the semiconductor substrate 100. Two N-type impurity regions are formed in the P well 100P. These two regions will serve respectively as source region S and drain region D of the access transistor AT. A gate electrode made of polysilicon or other material is formed on the P well portion between the source region S and drain region D via a gate insulating film (not shown). Here, the gate electrode makes up the two word lines WLn and WLn+1 associated with the gate lines of the two access transistors AT sharing the source contact SC.

The source region S is shared by the two access transistors AT and connected to the bit line BLn via the plug of the source contact SC. The bit line BLn is formed with a first wiring layer (1M).

A plug 104 and landing pad 105 (formed with the first wiring layer (1M)) are stacked on top of the drain region D. Further, the storage region MR of the variable cell resistor Rcell is formed on top of the plug 104. The storage region MR is part of a variable resistance layered film 106. The same film 106 is associated with the size of a lower electrode (refer to FIG. 9) whose bottom surface is connected to the plug 104. It is arbitrary in which layer of the layered wiring structure the variable resistance layered film 106 containing the variable cell resistor Rcell is formed. In this example, the variable cell resistor Rcell is formed in the second layer.

As illustrated in FIG. 9, the variable cell resistor Rcell includes an insulator film 102 and (ionic) conductor layer 103 between a lower electrode 101 and upper electrode 107. The upper electrode 107 is connected to the plate line PL. The plate line PL includes a third wiring layer (3M) and is disposed in the row direction as in FIG. 6 although not shown in FIG. 7. The plate line PL is connected to a plurality of memory cell pairs (cell column pairs) arranged in the row direction.

Although this is a repetition of what was described earlier, the plurality of plate lines PL may be shorted at the edge or outer portion of the memory cell array. Alternatively, the voltage levels of the plate lines PL may be controlled independently of each other.

The insulator film 102 shown in FIG. 9 can be made, for example, of an insulator such as SiN, $SiO_2$ or $Gd_2O_3$.

The conductor layer 103 can be made of a metal film containing, for example, at least one of Cu, Ag and Zn, an alloy film (e.g., CuTe alloy film) or a metal compound film. It should be noted that a metal element other than Cu, Ag and Zn may be used so long as the element is easy to ionize. The conductor layer 103 is provided as a "layer adapted to supply conductive ions."

As illustrated by an arrow in FIG. 9, if the write current Iw flows from the upper electrode 107 to the lower electrode 101, the positively ionized metal elements ($Cu^+$, $Ag^+$ and $Zn^+$) are attracted to the negative side and injected into the insulator film 102. As a result, a current path called a metal filament is formed in the insulator film 102. The ionized metals are connected together in the metal filament. The insulating property of the insulator film 102 will decline according to the concentration of the ionized metals, thus allowing for the same film 102 to serve as a variable resistance conductor layer (low resistance state).

In contrast, if the erase current Ie flows from the lower electrode 101 to the upper electrode 107, the ionized metal elements ($Cu^+$, $Ag^+$ and $Zn^+$) in the insulator film 102 are attracted to the negative side and transferred back to the conductor layer 103. As a result, the metal filament disappears, thus restoring the insulator film 102 to the initial state, i.e., the state in which the same film 102 serves as an insulator layer. This resets the variable cell resistor Rcell to a high resistance state.

[Write and Erase Operations of the Memory Cell Array]

A description will be given below of the data write and erase operations with reference to the circuit diagrams of the memory cell array with bias conditions shown in FIGS. 10 and 11.

It should be noted that a case will be described as an example in which a "second operation step of applying the second voltage via the well" is an erase step, and a "first operation step of applying the first voltage via the access transistor" a write step. The definition of the write and erase operations is arbitrary. Further, the channel conductivity type of the access transistor may be a P-channel type rather than an N-channel type as described below. In these cases, therefore, the description of the operation given below can be applied by analogy by interchanging the first and second operation steps as appropriate so that the PN junction formed between the well and the impurity region serving as the source or drain of the access transistor is forward-biased.

Figure 10:
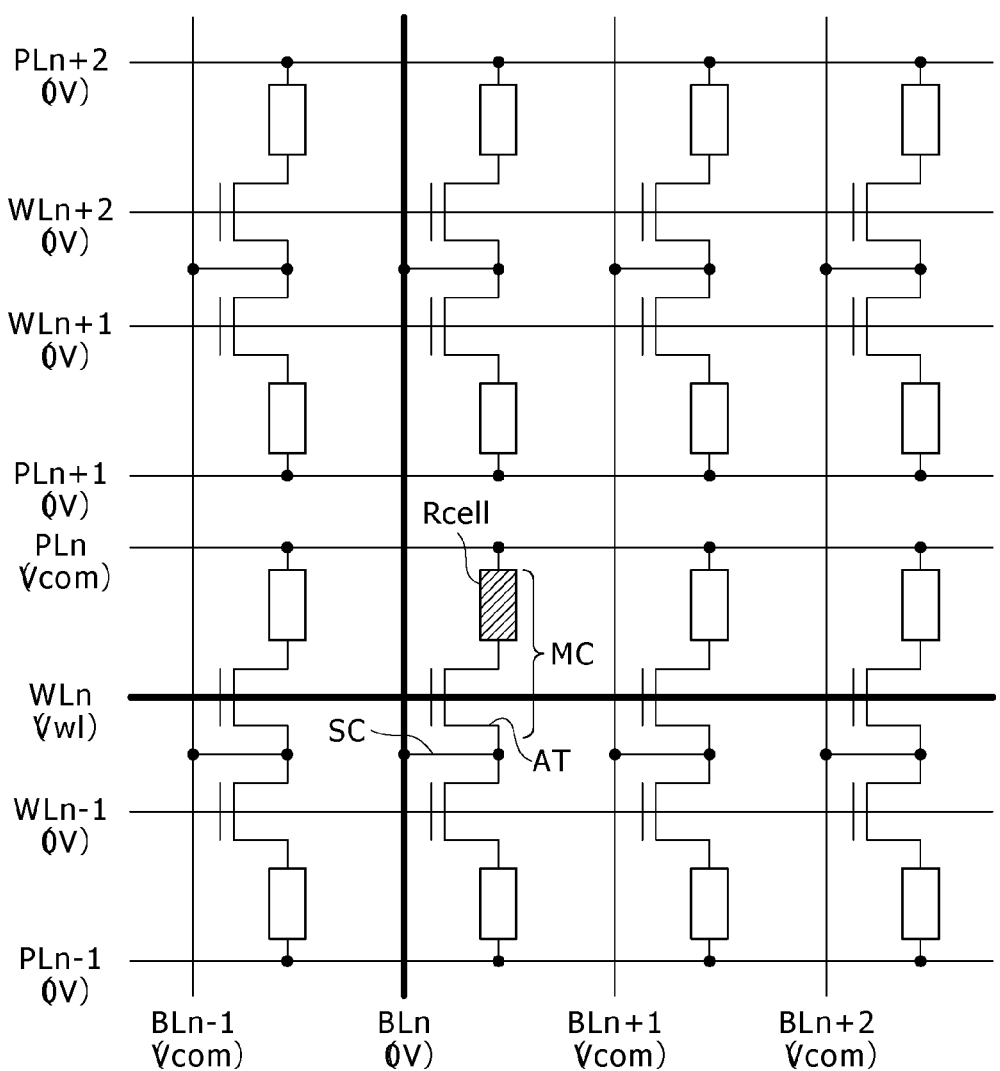
FIG. 10 is an equivalent circuit diagram of the memory cell array according to the embodiment of the present invention illustrating a bias setting example and wiring selection during write operation (first operation)

FIG. 10 illustrates a bias setting example and selected memory cell wirings during write operation. In FIG. 10, the wirings shown in bold lines are the selected bit line BLn and word line WLn. Further, the diagonally shaded area is the variable cell resistor Rcell of the selected memory cell MC. The circuit configuration was already described with reference to FIG. 6, and therefore the description thereof will be omitted here.

Data can be written on a bit-by-bit basis, i.e., on a memory-cell-MC-by-memory-cell-MC basis. Here, data is written to the memory cell MC shown in FIG. 10 so that the variable cell resistor Rcell thereof makes a transition to a low resistance state.

The same voltage (Vcom) may be applied to all the plate lines PLn−1 to PLn+2. Alternatively, the voltage (Vcom) may be applied only to the plate line PLn to which the selected memory cell MC is connected as illustrated in FIG. 10. In FIG. 10, 0 V is applied to all the plate lines PL to which the unselected memory cell columns are connected. The application of 0 V is intended to keep the impact of voltage fluctuation on the unselected variable cell resistors Rcell to a minimum. However, if the impact is slight, the same voltage may be applied to all the plate lines.

It should be noted that the term "voltage (Vcom)" refers, in this description of the operation, to the high-level write voltage Vw shown in FIG. 5, and the term "0 V" to the low-level write voltage.

Further, the positive voltage (Vwl) is applied to the word line WLn to which the selected memory cell MC is connected, and the unselected word lines are maintained at 0 V.

In this condition, 0 V is applied to the bit line BLn to which the selected memory cell MC is connected, and a positive voltage higher than 0 V such as the voltage (Vcom) is applied to the unselected bit lines.

As a result of this bias setting, no voltage is applied to the variable cell resistors Rcell of all the memory cells connected to the unselected word lines because these word lines are closed. On the other hand, no differential voltage develops between the source region S and drain region D (refer to FIG. 8) in the memory cells connected to the unselected bit lines because the voltage (Vcom) is applied across these memory cells. Therefore, a drain voltage required for the write operation is applied between the source region S and drain region D of only the selected memory cell MC. Here, a drain voltage Vdw required for the write operation satisfies the relationship, Vdw=(Vcom)−0 V> (Vth+), with the threshold voltage (Vth+) shown in FIG. 2. As a result, the transition <1> from a high to low resistance state, shown in FIG. 2, occurs.

It should be noted that the P well 100P shown in FIG. 8 is normally grounded to the GND level by the well driver 6 shown in FIG. 6 during this write operation.

Figure 11:
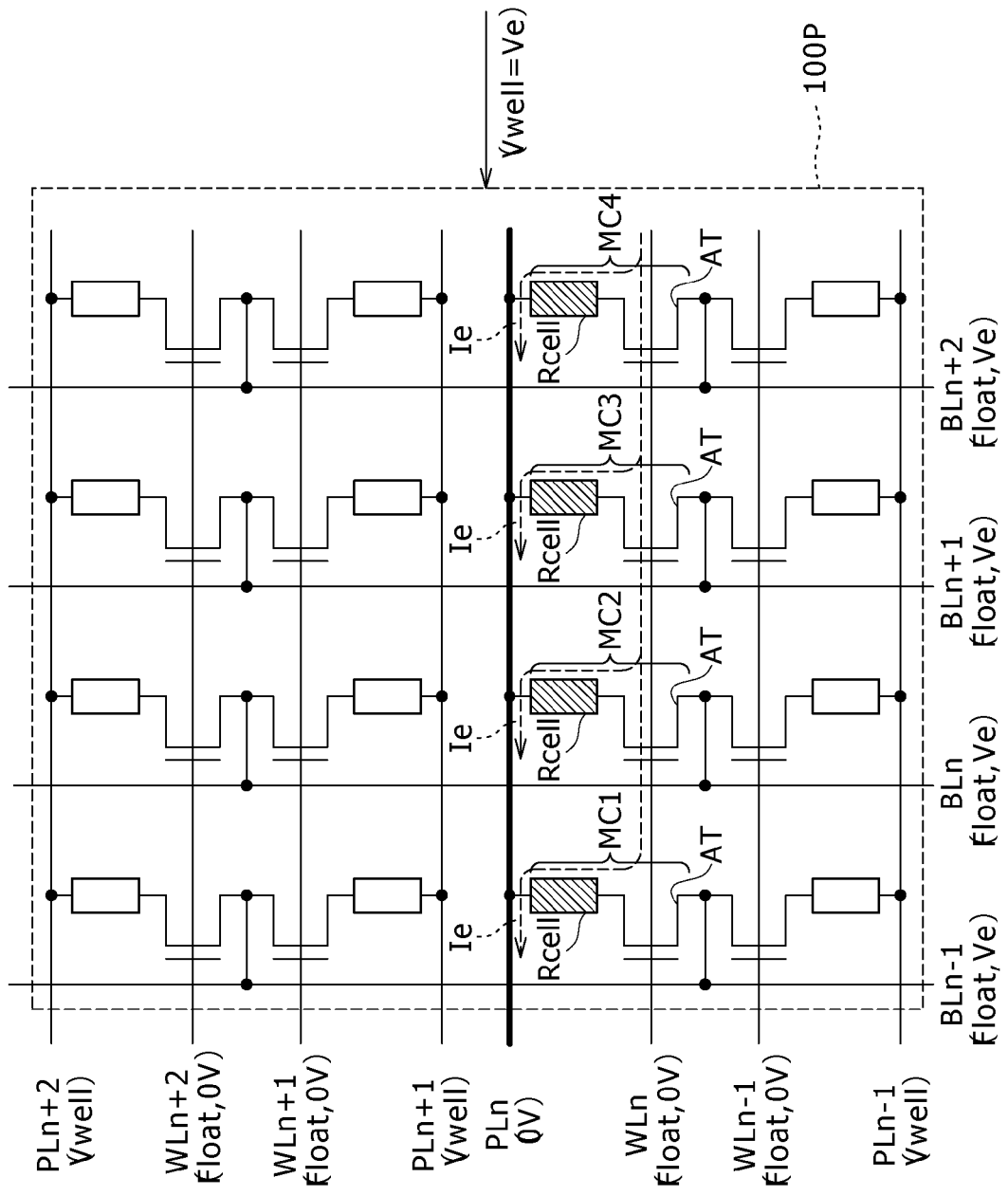
FIG. 11 is an equivalent circuit diagram of the memory cell array according to the embodiment of the present invention illustrating a bias setting example and wiring selection during erase operation (second operation)

FIG. 11 illustrates a bias setting example and selected memory cell wiring during erase operation. In FIG. 11, the wiring shown in a bold line is the selected plate line PLn. Further, the diagonally shaded area is the variable cell resistor Rcell to be erased in the selected memory cell MC. The circuit configuration was already described with reference to FIG. 6, and therefore the description thereof will be omitted here.

Data can be erased in units of the plurality of memory cells MC which belong to the cell row in the row direction connected in common to the selected plate line PLn. Here, data is erased from the four memory cells MC shown in FIG. 10, thus causing the variable cell resistors Rcell thereof to make a transition to a high resistance state.

It should be noted that if the memory cell array 1 is divided into subarray blocks and if the well potential can be controlled on a block-by-block basis, data can be erased on a block-by-block basis even in the same memory column. Further, the erase method similar to that for a flash EEPROM can also be used. With this method, all the memory cells in the memory cell array 1 or in a block can be erased in a single step.

To erase all the memory cells in a single cell row as illustrated in FIG. 11, the positive voltage (Vcom) is applied to the unselected plate lines PL to select only the plate line PLn, and a voltage lower than the voltage (Vcom) such as 0V is applied to the plate line PLn.

As described earlier, the operation associated with the erase operation (transition from a low to high resistance state) is conducted without using the access transistor AT. To accomplish this, all the word lines WLn−1 to WLn+2 and bit lines BLn−1 to BLn+2, i.e., control signal lines of the access transistors AT, are brought into a floating state (Float). Alternatively, the word lines WLn−1 to WLn+2 are grounded to 0V, and an erase voltage Ve is applied to the bit lines BLn−1 to BLn+2. Here, the erase voltage Ve is the same as the voltage applied to the P well 100P which will be described next.

This is intended to ensure that no voltage is applied to the PN junction (refer to FIG. 8) between the source region S and the P well 100P. Alternatively, however, the PN junction may be forward-biased to such an extent that the PN junction does not turn ON. Still alternatively, the PN junction may be reverse-biased to such an extent that the PN junction does not break down. On the other hand, the voltage applied to the word lines may be about half the erase voltage Ve (Ve/2) so as to relax the electric field applied to the gate insulating film.

It should be noted, however, that the application of a voltage, and particularly the erase voltage Ve, leads to wasteful power consumption. From the viewpoint of minimizing power consumption, all the word and bit lines should preferably be brought into a floating state (Float).

Further, the plate line PLn of the selected row (all the plate lines if all the memory cells in the memory cell array or in a block are erased in a single step) is set to 0V, and the plate lines of the unselected rows are biased with the voltage Vwell.

In this condition, the voltage Vwell applied to the well in the memory cell array 1 (in this case, the P well 100P because the NMOS access transistors AT are taken as an example) is changed from 0 V to the positive erase voltage Ve. This change is handled by the well driver 6 shown in FIG. 6.

As a result of this bias setting, the voltage Ve (P well)−0V (PLn) is applied to the vertical path between the P well 100P and plate line PL only for the selected row in the sectional view. This causes the erase current Ie to flow through this path because the PN junction between the P well 100P and drain region D is forward-biased. Part of the applied erase voltage Ve is consumed, for example, by the resistance within the P well, the ON resistance of the PN diode and the contact resistance. However, the majority thereof is applied to the variable cell resistors Rcell. When the voltage applied to the variable cell resistors Rcell is greater than the absolute value of the threshold voltage (Vth−) shown in FIG. 2, the transition <3> from a low to high resistance state as shown in FIG. 2 occurs.

It should be noted that, to erase the variable cell resistors Rcell connected to the plurality of rows, it is only necessary to set the plurality of associated plate lines PL to 0 V. Further, to erase all the variable cell resistors Rcell electrically connected to the well (in this case, P well 100P), it is only necessary to set all the plate lines PL of the memory cells whose access transistors AT are formed in the well to 0 V.

This erase operation is conducted at least on a row-by-row basis. As a result, an arbitrary bit (a memory cell) of information stored in the memory cell array 1 cannot be selectively erased. However, many of the existing non-volatile types of memory (e.g., flash EEPROM) are erased in minimum units of a block. Therefore, as long as this voltage setting method is applied to the erase operation, the fact that an arbitrary bit of information cannot be selectively erased in itself is not disadvantageous.

In the bipolar voltage-operated resistance change memory to which voltages of different polarity are applied between the write and erase operations, the storage element makes a transition from an insulated state to a state equivalent to metal resistance by the above operation. That is, when in a high resistance state, the storage element has a resistance of 1 MΩ or more and therefore is almost in an insulated state. When in a low resistance state, the storage element has a resistance of 100 kΩ, i.e., roughly the same as metal resistance. As a result, an enormous resistance change between these states occurs.

2. Second Embodiment

In a second embodiment, a well voltage supply structure is proposed which is effective in providing reduced well resistance for reduced variation in voltage applied to the storage element.

Figure 12:
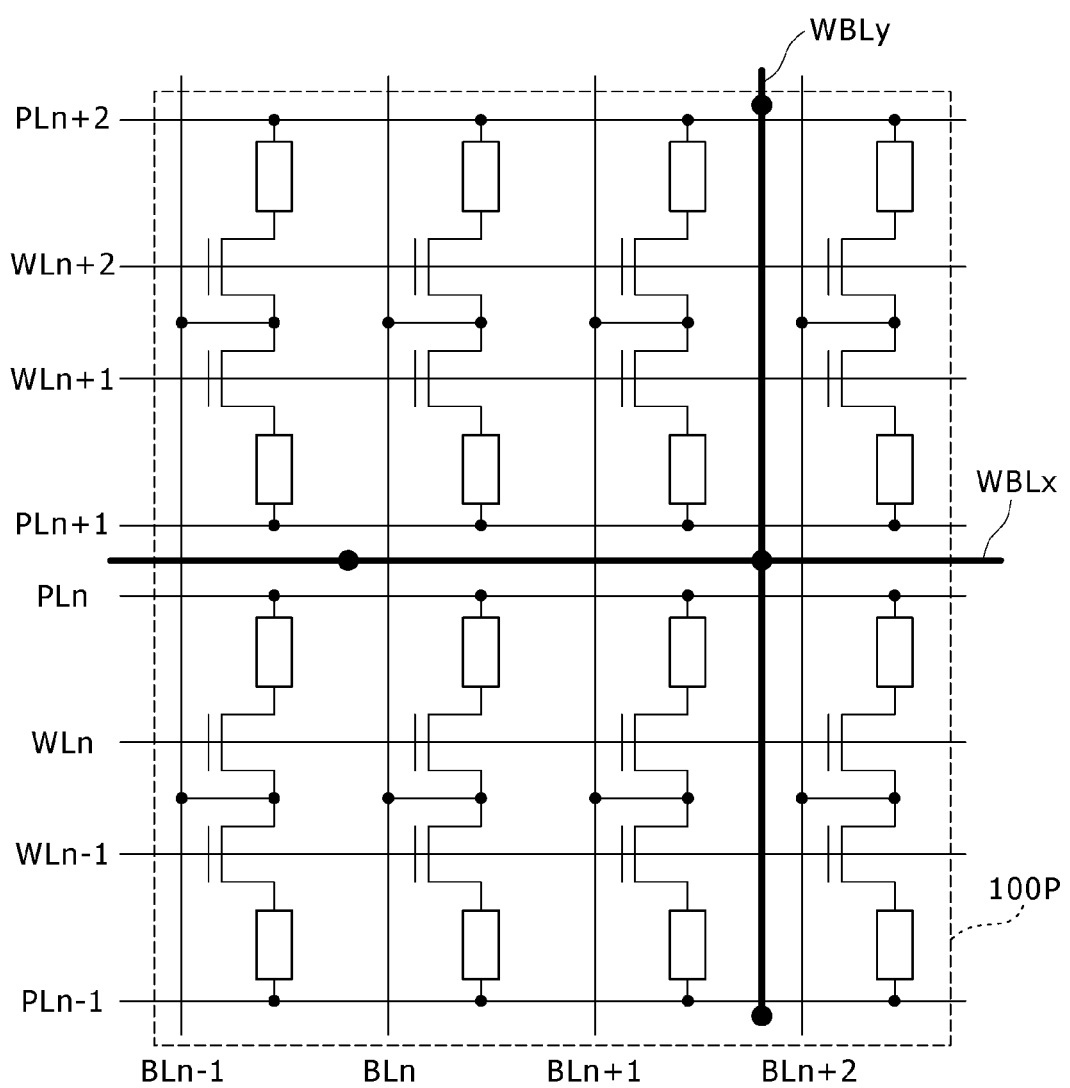
FIG. 12 is an equivalent circuit diagram of the memory cell array according to a second embodiment in which well bias supply lines are added.

FIG. 12 illustrates a circuit diagram of the memory cell array according to the second embodiment.

The memory cell according to the second embodiment differs from that according to the first embodiment shown in FIGS. 6 to 11 in that well bias supply lines WBLx and WBLy shown in FIG. 12 are added. The well bias supply lines WBLx and WBLy are mainly arranged in the x (row) and y (column) directions. At least one of the well bias supply lines WBLx and WBLy is enough to supply a well bias. Here, however, a case is illustrated in which the well bias supply lines are arranged in a grid pattern for the P well 100P.

The well bias supply lines WBLx and WBLy need only be electrically connected to the P well 100P and include a conductor layer or a conductor region having a resistance lower than the internal resistance of the P well 100P.

For example, either or both of the well bias supply lines WBLx and WBLy may be formed with a P$^+$ diffusion layer wiring higher in P-type concentration than the P well 100P (first embodiment). The P$^+$ diffusion layer wiring corresponds to a "well contact region" of the present invention.

Alternatively, P$^+$ diffusion layers higher in P-type concentration than the P well 100P may be disposed discretely in the P well 100P so that these layers are connected together in the overlying wiring layer (second embodiment). The P$^+$ diffusion layers correspond to a "well contact region" of the present invention.

The second embodiment may be applied to both or either of the well bias supply lines WBLx and WBLy. Further, the first embodiment in which only the P$^+$ diffusion layer wiring is provided and the second embodiment in which discrete P$^+$ diffusion layers are connected in a wiring layer may be combined to form both or either of the well bias supply lines WBLx and WBLy.

Still alternatively, a so-called backing wiring may be used in which both or either of the well bias supply lines WBLx and WBLy is connected to the overlying wiring layer via the P$^+$ diffusion layer wiring and discrete contacts.

If the well bias supply structure is applied to the fine cell pattern shown in FIG. 7, the well bias supply line WBLy may be formed, for example, as a buried diffusion layer for shallow trench isolation denoted by reference numeral "STI" in FIG. 7 (modification example of the first embodiment).

More specifically, a shallow trench isolation (STI) is formed by etching shallow trenches in the substrate surface and filling the trenches with an insulating material. At this time, before the insulating material is filled into the trenches, buried wirings of P$^+$ diffusion layers may be formed by diffusing a P-type impurity on the bottom surfaces of the trenches. The well bias supply lines WBLy using STI are disposed each between the bit lines BL in such a manner as to meander as do the bit lines BL. A number of the meandering well bias supply lines WBLy using STI extend long roughly in the y direction. Although not specifically illustrated, these well bias supply lines WBLy may be commonly connected together for the entire memory cell array 1. The same lines WBLy may alternatively be connected together with a connecting line provided on a block-by-block basis. The connecting lines are provided in the form of a rectangular frame on the surrounding portion of the P well 100P. An STI buried diffusion layer wiring may be used as a connecting line as for the well bias supply lines WBLy. Alternatively, the overlying wiring may be used as in the second embodiment. Still alternatively, both of the above or a backing wiring may be used.

The second embodiment provides reduced voltage supply resistance of the P well 100P, allowing almost the same voltage Vwell to be applied to all the memory cells. This ensures enhanced accuracy of the erase operation (write operation if the second embodiment is applied to the write operation).

The first and second embodiments provide the following common advantageous effects.

That is, the resistance of the data storage film (insulator film) changes in a reversible manner as voltages of different polarity are applied across the storage element. In this bipolar voltage-operated resistance change memory, voltage reduction can be readily achieved in the operation of the memory cells, each of which includes the variable cell resistor Rcell and access transistor AT.

More specifically, the semiconductor PN junction can be forward-biased using a well. This makes it possible to apply a required voltage across the storage element without using the access transistor AT. As a result, the source follower action of the access transistor AT is eliminated from the bipolar voltage-operated resistance change memory, thus contributing to reduced gate voltage.

Further, the reduced operating voltage permits downsizing of the access transistor AT, thus providing increased memory capacity. The reduced operating voltage also provides reduced power consumption. On the other hand, the well voltage is controlled at two levels, i.e., a positive voltage level (e.g., erase voltage Ve) and a level lower than the positive level (e.g., ground voltage), thus keeping the circuit scale of the well driver 6 to a minimum. Further, because the same well voltage can be applied across the memory cell array, there is no need to divide the well. As a result, the cell area will not increase because of the division of the well. The well voltage supply is used either for the write or erase operation, thus providing a greater freedom in the voltage setting. This protects the storage element from voltage stress and prevents malfunction of the memory cell (e.g., erroneous activation of the access transistor AT).

3. Modification Example

The access transistor AT and variable cell resistor Rcell shown in FIG. 1 may be interchanged. That is, the access transistor AT may be connected to the plate line PL, and the variable cell resistor Rcell connected directly to the bit line BL.

It should be noted, however, that the potential of the bit line BL frequently undergoes a significant change during operation. Therefore, the configuration shown in FIG. 1 is preferred because the effect of such a voltage change can be shut off by the access transistor AT in an OFF state (unselected).

Further, the set operation (transition from a high to low resistance state) was treated as the write operation, and the reset operation (transition from a low to high resistance state) as the erase operation. However, the set operation may be treated as the erase operation, and the reset operation as the write operation.

If the access transistor AT is formed with a P-type transistor, an N-type well (N well) must be used rather than the P well 100P, and a voltage must be applied so that the N well is negative.

In this case or in any case in which the P well is used as described above, the operation using the well may be associated with the set or reset operation. However, it is preferred that the operation using the well be associated with the reset operation, i.e., the operation adapted to cause the variable cell resistor Rcell to make a transition from a low to high resistance state.

In some case, the margin for applied voltage for achieving the set operation is small if there are a variety of causes of significant variation. In this case, the applied voltage must be controlled with accuracy during the set operation. In contrast, even if metal ions are transferred back to the (ionic) conductor layer by applying an excessive voltage during the reset operation, it is only necessary to retain the metal ions in the conductor layer. Therefore, the margin for applied voltage for the reset operation is generally larger than that for the set operation.

On the other hand, if a voltage is applied via the well, the well conductance cannot be indiscriminately increased in many cases because the well conductance is also related to the characteristics of the transistor. Therefore, the voltage applied to the storage element via the well generally tends to vary more significantly across the IC surface than that applied via the wiring layer.

This is the reason why the reset operation by voltage application via the well is preferred.

The second embodiment ensures more uniform voltage applied to the storage elements via the well across the IC surface, thus relaxing the restriction. In particular, the second embodiment permits the set operation to be conducted via the well with more ease.

Further, the present invention is not limited to the above embodiments and modification example so long as it is applied to a bipolar voltage-operated resistance change memory in which voltages of different polarity are applied to the storage element.

The present application contains subject matter related to that disclosed in Japanese Priority Patent Application JP 2009-098639 filed in the Japan Patent Office on Apr. 15, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A resistance change memory device comprising:
   memory cells, each of which has a current path in which a storage element, whose resistance changes according to a voltage applied, and an access transistor are connected in series;
   first wirings connected to first ends of the current paths;
   second wirings connected to second ends of the current paths;
   a well which is a semiconductor region in which the access transistors are formed; and
   a drive circuit adapted to supply a current in a first direction to one or more of the storage elements via the access transistor by applying a voltage between the first and second wirings during a first operation, the drive circuit also adapted to supply a current to the one or more storage elements in a second direction opposite the first direction by applying a voltage of opposite polarity between the first or second wiring and well during a second operation,
   wherein,
   the first operation one of a data write and a data erase operation, and
   the second operation is the other of the data write and a data erase operation.

2. The resistance change memory device of claim 1, wherein
   the access transistors are connected to the first wirings, and the storage elements are connected to the second wirings, and
   a positive voltage relative to the potential of the first wirings is applied to the second wirings during the first operation.

3. The resistance change memory device of claim 2, wherein for each memory cell;
   the well has a P-type conductivity,
   two N-type semiconductor regions are provided in the P-type well, and
   the P-type well is connected to the storage element via one of the two N-type semiconductor regions.

4. The resistance change memory device of claim 1, wherein each storage element has two electrodes and includes a layered body in which a storage layer made of an insulator and an ion supply layer containing one of Cu, Ag and Zn and one of S, Se and Te are stacked between the two electrodes.

5. The resistance change memory device of claim 1 comprising:
   a memory cell array including a plurality of memory cells arranged in a matrix form; and
   access lines adapted to control the access transistors of the memory cells arranged in one direction of all the plurality of memory cells,
   wherein,
   the first wirings are commonly connected to the access transistors of the memory cells arranged in another direction of all the plurality of memory cells.

6. The resistance change memory device of claim 5, wherein:
   well contact regions identical in conductivity type to and higher in conductance than the wells are formed in the wells, and
   the plurality of well contact regions are arranged in lines at equal intervals in the memory cell array.

7. The resistance change memory device of claim 5, wherein:
   well contact regions identical in conductivity type to and higher in conductance than the wells are arranged discretely in the wells, and
   the plurality of discretely arranged well contact regions are connected together to a wiring layer.

8. A resistance change memory device operating method comprising:
   a first operation step of applying, during either one of data write and erase operations, a first voltage to a storage element of a memory cell having a current path in which the storage element, whose resistance changes according to the applied voltage, and an access transistor are connected in series; and
   a second operation step of applying, during the other of the data write and erase operations, a second voltage of opposite polarity to the first voltage to the storage element,
   wherein,
   in the first operation step, the first voltage is applied to the storage element by applying a voltage across the current path, and
   in the second operation step, the second voltage is applied to the storage element by applying a voltage relative to the potential at one end of the storage element to a well, the well being electrically connected to the other end of the storage element and being a semiconductor region in which the access transistors are formed.

9. A resistance change memory comprised of
   a plurality of memory cells, each memory cell comprising
   (a) a storage element whose resistance changes in accordance with a voltage applied across the storage element, (b) an access transistor connected in series with the storage element, (c) a well in which the access transistor is formed; and (d) a current path through the storage element and the access transistor,
   first wirings connected to first ends of the current paths; and
   second wirings connected to second ends of the current paths; and
   a drive circuit configured to applied voltages between the first and second wirings to effect first and second operations on the storage elements,
   wherein,
   in the first operation, a current is caused to travel through each selected storage element in a first direction by application of a voltage of a first polarity between the first and second wirings,
   in the second operation, a current is caused to travel through each selected storage element in a second direction opposite the first direction by application of a voltage of a second polarity opposite the first polarity between the well and the first or second wiring, the first operation is either a data write operation or data erase operation, and the second operation is the other of the data write and data erase operations.

* * * * *